United States Patent
Zhou

(10) Patent No.: US 11,664,372 B2
(45) Date of Patent: May 30, 2023

(54) SEMICONDUCTOR DEVICE INTEGRATING SILICON-BASED DEVICE WITH SEMICONDUCTOR-BASED DEVICE AND METHOD FOR FABRICATING THE SAME

(71) Applicant: United Microelectronics Corp., Hsinchu (TW)

(72) Inventor: Zhi-Biao Zhou, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 145 days.

(21) Appl. No.: 16/262,779

(22) Filed: Jan. 30, 2019

(65) Prior Publication Data

US 2020/0243515 A1 Jul. 30, 2020

(51) Int. Cl.
| | |
|---|---|
| *H01L 27/06* | (2006.01) |
| *H01L 27/12* | (2006.01) |
| *H01L 21/768* | (2006.01) |
| *H01L 23/522* | (2006.01) |
| *H01L 21/762* | (2006.01) |
| *H01L 23/528* | (2006.01) |

(52) U.S. Cl.
CPC .... *H01L 27/0688* (2013.01); *H01L 21/76251* (2013.01); *H01L 21/76898* (2013.01); *H01L 23/528* (2013.01); *H01L 23/5226* (2013.01); *H01L 27/1203* (2013.01)

(58) Field of Classification Search
CPC ......... H01L 21/76251; H01L 21/76898; H01L 23/5226; H01L 23/528; H01L 27/0688; H01L 27/1203; H01L 21/8221; H01L 21/823481; H01L 21/84; H01L 23/481; H01L 27/0694; H01L 27/088

See application file for complete search history.

(56) References Cited

U.S. PATENT DOCUMENTS

| | | | |
|---|---|---|---|
| 4,939,568 | A | 7/1990 | Kato et al. |
| 9,142,620 | B2 | 9/2015 | Ritenour et al. |
| 9,349,807 | B2 | 5/2016 | Kuraguchi |
| 2018/0019259 | A1* | 1/2018 | Hall ................. H01L 21/76895 |
| 2018/0277632 | A1* | 9/2018 | Fanelli ............. H01L 21/76256 |
| 2020/0083253 | A1* | 3/2020 | Cheng ..................... H01L 21/84 |
| 2020/0135766 | A1* | 4/2020 | Dutta ................. H01L 21/0254 |
| 2020/0194427 | A1* | 6/2020 | Dewey ..................... H01L 29/20 |
| 2020/0212020 | A1* | 7/2020 | Zhang ................... H01L 21/563 |
| 2020/0303244 | A1* | 9/2020 | Zhang ..................... H01L 21/84 |

FOREIGN PATENT DOCUMENTS

WO WO-2018063160 A1 * 4/2018 ....... H01L 21/76898

* cited by examiner

*Primary Examiner* — Steven M Christopher
(74) *Attorney, Agent, or Firm* — J.C. Patents

(57) ABSTRACT

A semiconductor device is provided, including a buried oxide layer, having a first side and a second side. A silicon-based device layer is disposed on the first side of the buried oxide layer. The silicon-based device layer includes a first interconnection structure. A semiconductor-based device layer is disposed on the second side of the buried oxide layer. The semiconductor-based device layer includes a second interconnection structure.

9 Claims, 5 Drawing Sheets

SEMICONDUCTOR DEVICE INTEGRATING SILICON-BASED DEVICE WITH SEMICONDUCTOR-BASED DEVICE AND METHOD FOR FABRICATING THE SAME

BACKGROUND

1. Field of the Invention

The present invention generally relates to semiconductor fabrication technology, and particularly to a method for fabricating semiconductor device with silicon-based device and the semiconductor-based device.

2. Description of Related Art

To have more functionality and better performance, an integrated circuit is designed with various semiconductor devices. In an example, the integrated circuit may also include the radio-frequency (RF) component in co-operation with the circuit which is not involved in the RF operation. In addition, to fabricate the integrated circuit, the fabrication may also use the silicon-on-insulator (SOI) substrate to fabricate the silicon-based device. In addition, the RF component may also be the RF power amplifier (PA) or RF power management unit (PMU) or any related component.

However, the performance of the RF components formed from the silicon-based device may be not sufficient. Then the RF components may be formed from a by GaN-based device, which has better performance under RF operation.

How to properly integrate the silicon-based device and the GaN-based device together as an integrated circuit is still an issue to develop in semiconductor fabrication technology.

SUMMARY OF THE INVENTION

The invention provides a semiconductor device and a fabrication method thereof, in which the semiconductor-based device and the Si-base device can be formed at both sides of a buried layer, based on the SOI fabrication process.

In an embodiment, the invention provides a semiconductor device, which comprises a buried oxide layer, having a first side and a second side. A silicon-based device layer is disposed on the first side of the buried oxide layer. The silicon-based device layer comprises a first interconnection structure. A semiconductor-based device layer is disposed on the second side of the buried oxide layer. The semiconductor-based device layer comprises a second interconnection structure.

In an embodiment, as to the semiconductor device, the silicon-based device layer comprises a silicon layer on the first side of the buried oxide layer and the semiconductor-based device layer comprises a semiconductor layer on the second side of the buried oxide layer.

In an embodiment, as to the semiconductor device, the buried oxide layer and the silicon layer form a silicon-on-insulator (SOI) structure.

In an embodiment, as to the semiconductor device, the buried oxide layer and the semiconductor layer form a semiconductor-on-insulator structure.

In an embodiment, as to the semiconductor device, the semiconductor-based device layer comprises a semiconductor-based device on the semiconductor layer and the silicon-based device layer comprises a silicon-based device on the silicon layer.

In an embodiment, as to the semiconductor device, the buried oxide layer has a thickness to mechanically support the semiconductor-based device layer by direct contact.

In an embodiment, as to the semiconductor device, the first interconnection layer comprises a first route structure and a first inter-layer dielectric layer enclosing the first route structure. The second interconnection layer comprises a second route structure and a second inter-layer dielectric layer enclosing the second route structure.

In an embodiment, as to the semiconductor device, it further comprises a third route structure in the buried oxide layer, to electrically connect the first route structure and the second route structure.

In an embodiment, as to the semiconductor device, the third route structure comprises a via through the buried oxide layer to electrically connect the first route structure and the second route structure.

In an embodiment, as to the semiconductor device, the semiconductor-based device layer comprises a semiconductor-based device operated in a radio frequency (RF) range.

In an embodiment, the invention also provides a method for fabricating semiconductor device. The method comprises providing a staked layer of a semiconductor layer, a buried oxide layer and a silicon layer. A silicon-based device layer is formed, comprising the silicon layer on the buried oxide layer. A first interconnection layer is formed over the silicon-based device layer. A semiconductor-based device layer is formed, comprising the semiconductor layer on the buried oxide layer. A second interconnection layer is formed over the semiconductor-based device layer.

In an embodiment, as to the method for fabricating semiconductor device, the step of providing the staked layer comprising: forming the semiconductor layer on a supporting substrate; forming the buried oxide layer on the semiconductor layer; and forming the silicon layer on the buried oxide layer. The supporting substrate is removed to expose the semiconductor layer before the step of forming the semiconductor-based device layer.

In an embodiment, as to the method for fabricating semiconductor device, the buried oxide layer and the silicon layer form a silicon-on-insulator (SOI) structure.

In an embodiment, as to the method for fabricating semiconductor device, the buried oxide layer and the semiconductor layer form a semiconductor-on-insulator structure.

In an embodiment, as to the method for fabricating semiconductor device, the semiconductor-based device layer comprises a semiconductor-based device on the semiconductor layer and the silicon-based device layer comprises a silicon-based device on the silicon layer.

In an embodiment, as to the method for fabricating semiconductor device, the buried oxide layer has a thickness to mechanically support the semiconductor-based device layer by direct contact.

In an embodiment, as to the method for fabricating semiconductor device, the step of forming the first interconnection layer comprises forming a first route structure and a first inter-layer dielectric layer enclosing the first route structure. The step of forming the second interconnection layer comprises forming a second route structure and a second inter-layer dielectric layer enclosing the second route structure.

In an embodiment, as to the method for fabricating semiconductor device, the method further comprises forming a third route structure in the buried oxide layer, to electrically connect the first route structure and the second route structure.

In an embodiment, as to the method for fabricating semiconductor device, the third route structure comprises a via through the buried oxide layer to electrically connect the first route structure and the second route structure.

In an embodiment, as to the method for fabricating semiconductor device, the semiconductor-based device layer comprises a semiconductor-based device operated in a radio frequency (RF) range.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor device with silicon-based device and the semiconductor-based device, which are integrated and is fabricated based on the SOI structure.

Several embodiments are provided for describing the invention but the invention is not limited to the embodiments as provided.

The invention takes the SOI structure to fabricate the usual silicon-based device. However, the invention additionally introduces a semiconductor layer on the SOI structure, so the semiconductor-base device can be continuously fabricated over the silicon-based device from the opposite side, in which the buried oxide layer belonging to the SOI structure may be commonly used to fabricate the semiconductor-based device.

FIG. 1A to FIG. 1E are drawings, schematically illustrating the method for fabricating semiconductor device, according to an embodiment of the invention.

Figure 1A:
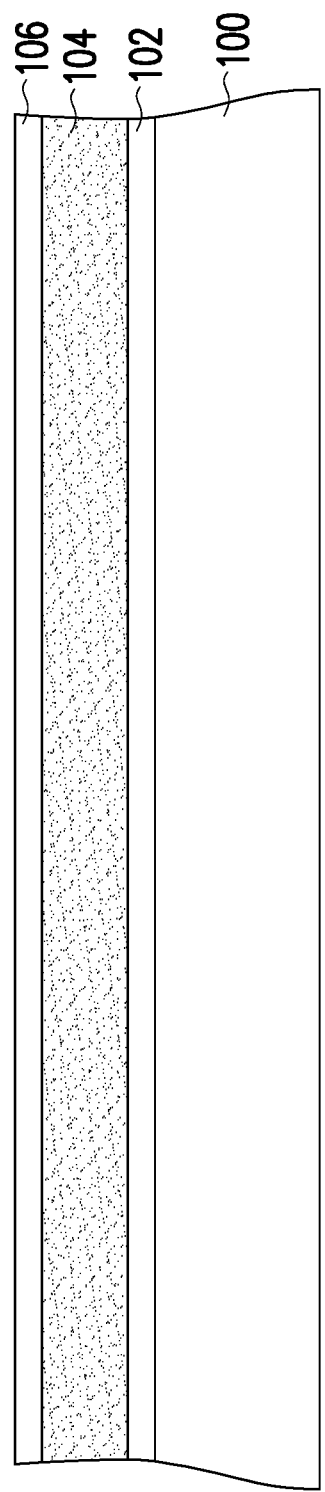
FIG. 1A to FIG. 1E are drawings, schematically illustrating the method for fabricating semiconductor device, according to an embodiment of the invention.

Referring to FIG. 1A, to have the SOI structure, a substrate 100 is provided for mechanical supporting. The substrate 100 in an embodiment may be a silicon substrate or a glass substrate. A semiconductor layer 102 is formed on the substrate 100. A buried oxide layer 104 is formed on the semiconductor layer 102 and a silicon layer 106 is formed on the buried oxide layer 104. The semiconductor layer 102, the buried oxide layer 104, and the silicon layer 106 form a stack structure foe fabrication base, in which the silicon layer 106 on the buried oxide layer 104 forms the SOI structure.

As to be noted, the semiconductor layer 102 here may be one of GaN, $Ga_2O_3$, GaO, SiC, HSiC, AN, AlGaN, etc. in an embodiment. The semiconductor layer 102 may provide the channel for the semiconductor-based transistor in an embodiment. However, the semiconductor layer 102 comprises gallium may be used to integrate with a silicon-based device at two sides of the whole device.

Figure 1B:
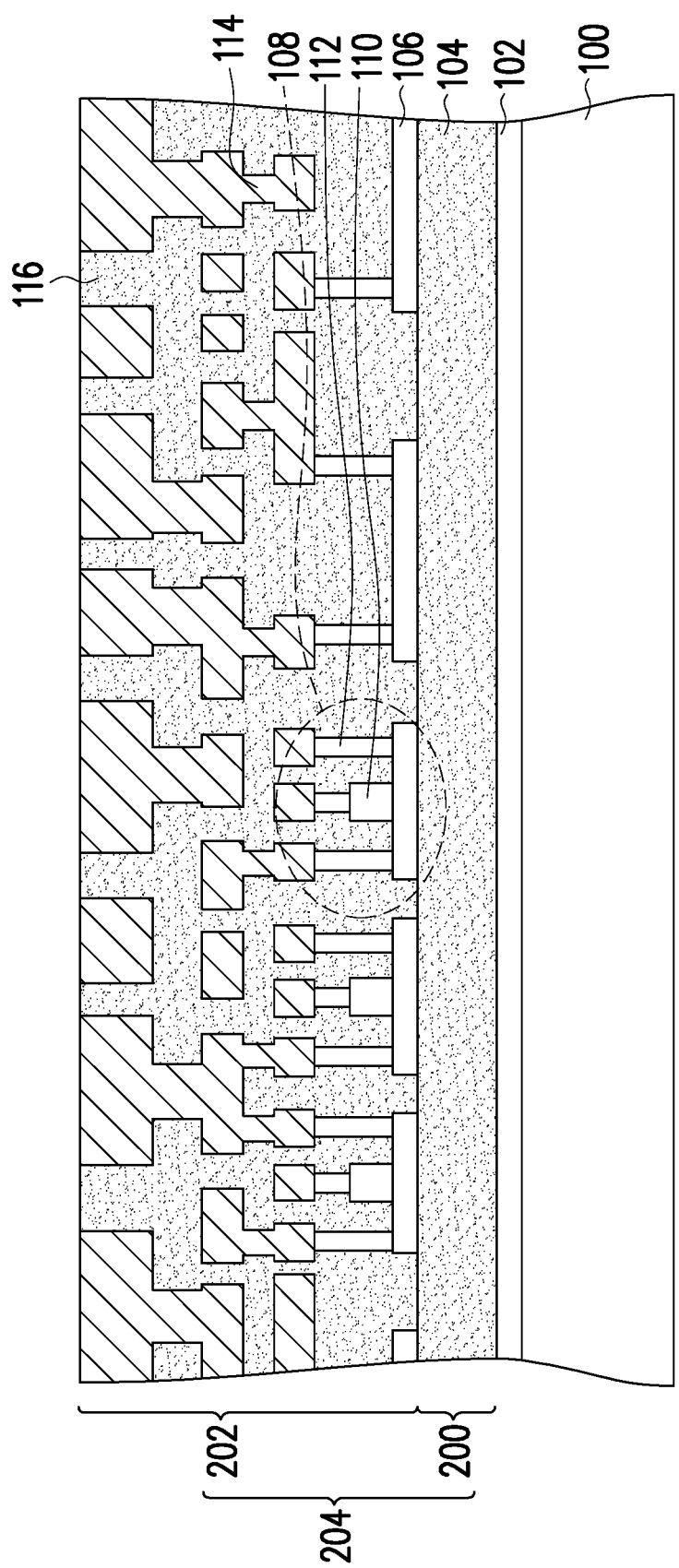

Referring to FIG. 1B, the silicon layer 106 is patterned to provide the silicon base for the silicon-based devices 108, such as the metal-oxide-semiconductor (MOS) transistors. The silicon-based device 108 may also be any other device involving the silicon layer 106.

As usually known, the silicon-based device 108 needs the route structure 114 to interconnect to other device components. Generally as to fabrication, the structures of the silicon-based device 108 and the route structure 114 are formed through the inter-layer dielectric layer 116. The route structure 114 with the inter-layer dielectric layer 116 is known as the interconnection structure. Generally, the silicon-based device layer 202 is formed on the buried oxide layer 104 at one side. The silicon-based device layer 202 includes the silicon-based device 108 and the interconnection structure of the route structure 114 with the inter-layer dielectric layer 116. The silicon-based device 108 includes a portion of the silicon layer 106, a device structure 110 on the silicon layer 106, and a contact 112 to contact the device structure 110 with the silicon layer 106. In an embodiment, the silicon-based device 108 may be a MOS transistor, switch, or any suitable device based on silicon material, but not limited to.

So far, as to the fabrication, the silicon-based device layer 202 is formed on the buried oxide layer 104, which may also be referred as a base layer 200, which is integrated with the silicon-based device layer 202 as a first device layer 204.

Figure 1C:
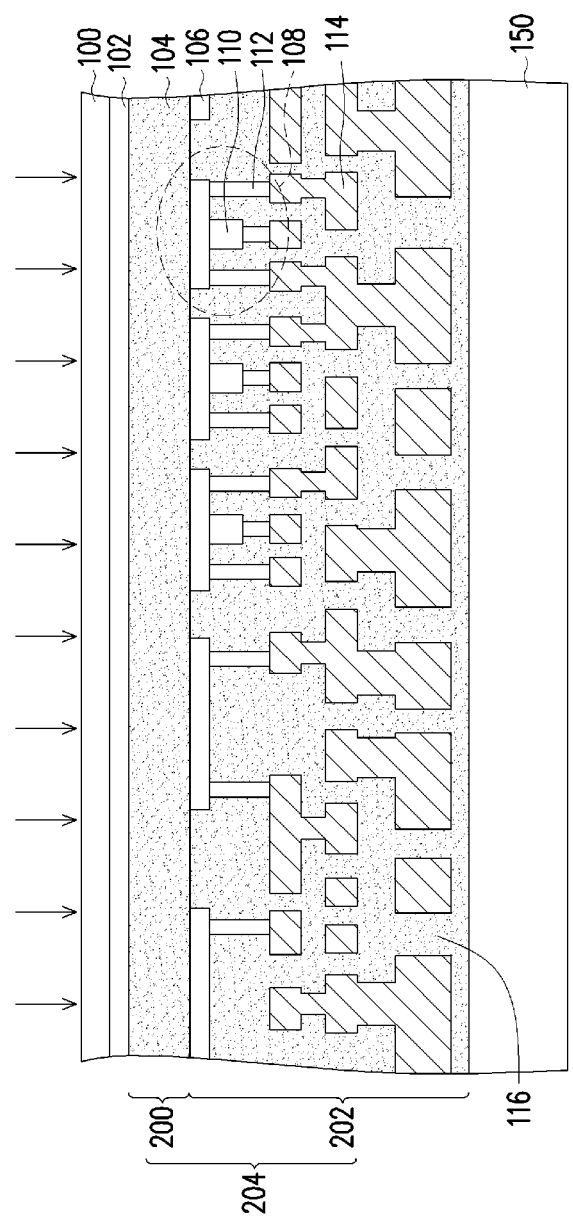
Figure 1D:
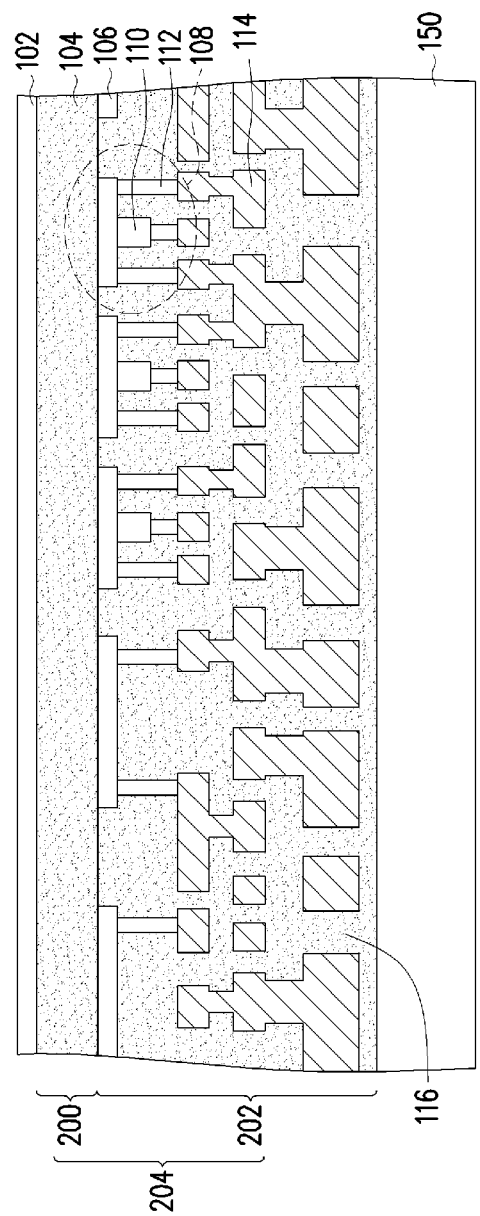

Referring to FIG. 1C, the first device layer 204 is flipped onto another supporting substrate 150, so the substrate 100 is at top. The substrate 100 is removed. In an embodiment, if the substrate 100 is a silicon substrate, then a polishing or an etching process may be performed to gradually removed the substrate 100. Referring to FIG. 1D, the substrate 100 is then completely removed to expose the semiconductor layer 102.

Figure 1E:
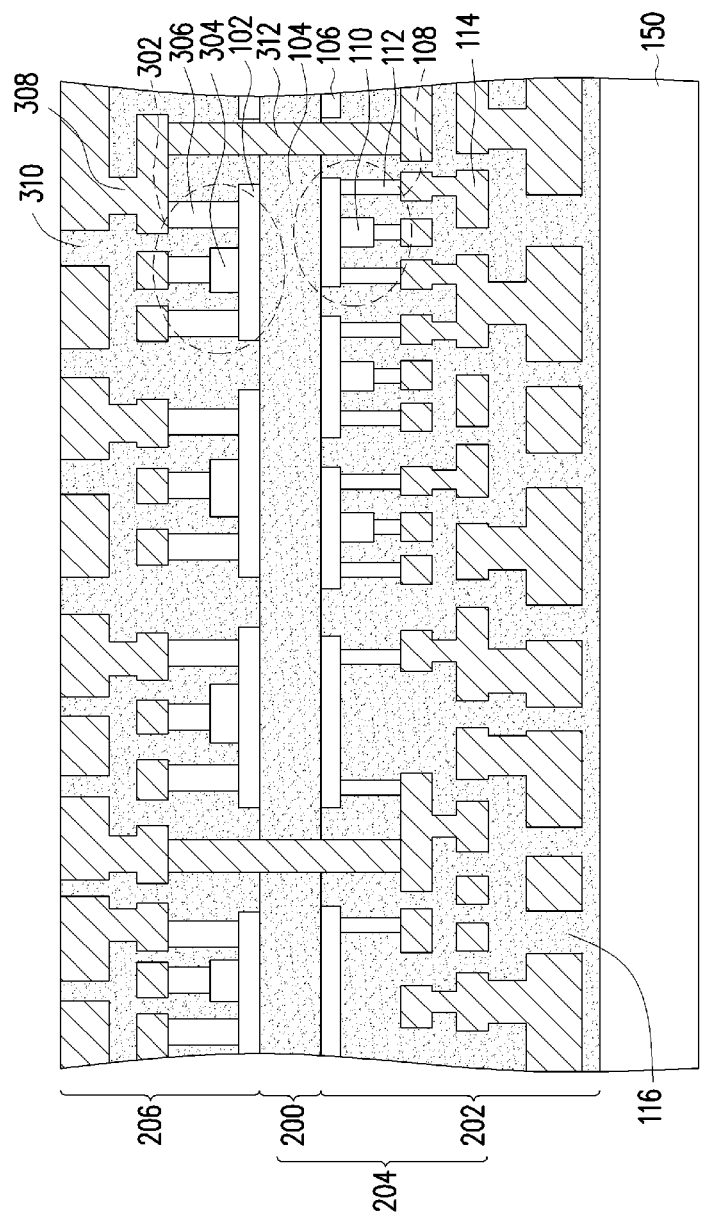

Referring to FIG. 1E, the semiconductor layer 102 is patterned to provide the semiconductor base for the semiconductor-based device 302. The semiconductor-based device 302 may include the semiconductor layer 102 and the device structure 304 on the semiconductor layer 102 and further the contact 306 as needed. The semiconductor-based device 302 in the embodiment represent a general structure. As to the application for the RF device, it can be the power amplifier (PA), power management unit (PMU), or any suitable device based on semiconductor material. In order to interconnect the semiconductor-based device 302 to the other part, the inter-connection structure, including the route structure 308 and the inter-layer dielectric layer 310, is also subsequently fabricated.

Further, another route structure 312, include the via structure, is also fabricated through the buried oxide layer 104, so to interconnect the route structure 308 and the route structure 114. As a result, the semiconductor-based device 302 and the silicon-based device 108 are properly interconnected as a single integrated circuit. Generally, the semiconductor-based device layer 206 is referred, including the related various device structures. The semiconductor-based device layer 206 is formed on the buried oxide layer at another side opposite to the silicon-based device layer 202.

In fabrication, the buried oxide layer 104 provides the mechanical base for forming the semiconductor-based device 302. The thickness of the buried oxide layer 104 is sufficient to support the fabrication of the semiconductor-based device layer 202. In an embodiment, the thickness of the buried oxide layer 104 may be about 500 angstroms but the invention is not limited to. In the invention, the semiconductor-based device 302 is directly fabricated over the buried oxide layer 104 and the semiconductor layer 102.

In addition, the supporting substrate 150 is removed, so to have the integrated structures at both sides of the buried oxide layer 104. The fabrication of the semiconductor-based device in the invention may be straightforwardly fabricated. The whole structure may efficiently integrate the semiconductor-based device 302 with the silicon-based device 108.

Further, the silicon-based device layer 202 and/or the semiconductor-based device may also include other related passive devices in fabrication process. As a result, the circuit of all-in-one structure may be easily fabricated, in which the RF component may be involved. The package size of the semiconductor device can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a buried oxide layer;
a silicon-based device layer, disposed on the buried oxide layer, wherein the silicon-based device layer comprises a first interconnection structure; and
a semiconductor-based device layer, disposed on the buried oxide layer, wherein the semiconductor-based device layer comprises a second interconnection structure and a GaN layer to provide a channel capability of a semiconductor-based transistor,
wherein the silicon-based device layer and the semiconductor-based device layer are disposed on opposing sides of the buried oxide layer,
wherein the silicon-based device layer includes a MOS transistor,
wherein the semiconductor-based device layer comprises a GaN-based device, and the GaN-based device is a radio frequency (RF) device.

2. The semiconductor device of claim 1, wherein the silicon-based device layer comprises a silicon layer on the buried oxide layer.

3. The semiconductor device of claim 2, wherein the buried oxide layer and the silicon layer form a silicon-on-insulator (SOI) structure.

4. The semiconductor device of claim 2, wherein the buried oxide layer and the GaN layer form a semiconductor-on-insulator structure.

5. The semiconductor device of claim 2, wherein the GaN-based device is disposed on the GaN layer.

6. The semiconductor device of claim 1, wherein the buried oxide layer has a thickness to mechanically support the semiconductor-based device layer by direct contact.

7. The semiconductor device of claim 1,
wherein the first interconnection structure comprises a first route structure and a first inter-layer dielectric layer enclosing the first route structure,
wherein the second interconnection structure comprises a second route structure and a second inter-layer dielectric layer enclosing the second route structure.

8. The semiconductor device of claim 7, further comprising a third route structure in the buried oxide layer, to electrically connect the first route structure and the second route structure.

9. The semiconductor device of claim 8, wherein the third route structure comprises a via through the buried oxide layer to electrically connect the first route structure and the second route structure.

* * * * *